US011910532B2

(12) United States Patent
Kuroda et al.

(10) Patent No.: US 11,910,532 B2
(45) Date of Patent: Feb. 20, 2024

(54) AUTOMATIC BACK-UP PIN ARRANGEMENT SYSTEM FOR COMPONENT MOUNTING MACHINE

(71) Applicant: FUJI CORPORATION, Chiryu (JP)

(72) Inventors: Hideya Kuroda, Toyota (JP); Hiroyoshi Sugita, Kariya (JP)

(73) Assignee: FUJI CORPORATION, Chiryu (JP)

( * ) Notice: Subject to any disclaimer, the term of this patent is extended or adjusted under 35 U.S.C. 154(b) by 78 days.

(21) Appl. No.: 17/628,858

(22) PCT Filed: Aug. 28, 2019

(86) PCT No.: PCT/JP2019/033743
§ 371 (c)(1),
(2) Date: Jan. 20, 2022

(87) PCT Pub. No.: WO2021/038763
PCT Pub. Date: Mar. 4, 2021

(65) Prior Publication Data
US 2022/0256749 A1 Aug. 11, 2022

(51) Int. Cl.
*B23P 19/00* (2006.01)
*H05K 13/04* (2006.01)
*H05K 13/00* (2006.01)

(52) U.S. Cl.
CPC ..... *H05K 13/0452* (2013.01); *H05K 13/0069* (2013.01); *H05K 13/0495* (2013.01)

(58) Field of Classification Search
CPC ........... H05K 13/0061; H05K 13/0069; H05K 13/0452; H05K 13/0495
See application file for complete search history.

(56) References Cited

U.S. PATENT DOCUMENTS

| 11,375,650 B2* | 6/2022 | Ito ..................... H05K 13/0069 |
| 2007/0073428 A1 | 3/2007 | Oohashi et al. |
| 2016/0225136 A1 | 8/2016 | Kawai |

(Continued)

FOREIGN PATENT DOCUMENTS

| EP | 3 331 338 A1 | 6/2018 |
| JP | 4337622 B2 | 9/2009 |

(Continued)

OTHER PUBLICATIONS

International Search Report dated Nov. 5, 2019 in PCT/JP2019/033743 filed on Aug. 28, 2019, 1 page.

*Primary Examiner* — Paul D Kim
(74) *Attorney, Agent, or Firm* — Oblon, McClelland, Maier & Neustadt, L.L.P.

(57) ABSTRACT

A component mounting machine automatically arranges backup pins at positions designated in a production job. A control device configured to control an operation of each of the component mounting machines determines whether a backup pins exists at a position where the backup pin cannot be automatically arranged in the arrangement of the backup pins designated in the production job, and when the backup pin exist at a position where the backup pin cannot be automatically arranged, excludes the backup pins at the position from the arrangement of the backup pins designated in the production job not to be automatically arranged, and automatically arranges only the other backup pins at the positions designated in the production job.

3 Claims, 7 Drawing Sheets

(56) References Cited

U.S. PATENT DOCUMENTS

| | | | | |
|---|---|---|---|---|
| 2018/0199479 A1* | 7/2018 | Kawai | ................ | H05K 13/0857 |
| 2020/0113095 A1* | 4/2020 | Kanda | ................ | H05K 13/0061 |
| 2021/0219473 A1* | 7/2021 | Kanda | .................... | B25J 9/0096 |
| 2022/0295681 A1* | 9/2022 | Kuroda | .............. | H05K 13/0408 |

FOREIGN PATENT DOCUMENTS

| | | | |
|---|---|---|---|
| JP | 2010-62591 | A | 3/2010 |
| JP | 2010-278269 | A | 12/2010 |
| JP | 2011-14627 | A | 1/2011 |
| JP | 4626368 | B2 | 2/2011 |
| WO | WO 2015/040755 | A1 | 3/2015 |

* cited by examiner

IMAGE VIEW OF ARRANGEMENT OF BACKUP PINS DESIGNATED IN PRODUCTION JOB

AUTOMATIC BACK-UP PIN ARRANGEMENT SYSTEM FOR COMPONENT MOUNTING MACHINE

TECHNICAL FIELD

The present specification discloses a technique related to an automatic backup pin arrangement system for a component mounting machine configured to automatically arrange backup pins at positions designated in a production job, and the backup pins are capable of holding a circuit board, on which a component is mounted, from below.

BACKGROUND ART

Since a component mounting board in recent years has become thinner and has been easier to bend, in a case where a component is mounted on a circuit board by a component mounting machine, the circuit board is held by backup pins from below to prevent the circuit board from bending. Further, as described in Patent Literature 1 (International Publication No. WO2015/040755), in order to change an arrangement of backup pins according to a size or the like of a circuit board, there is a component mounting machine configured to automatically arrange the backup pins. In the component mounting machine, when the backup pins are automatically arranged, the backup pins are held by a chuck or the like attached to an XY-robot, and the backup pins are automatically arranged at positions designated in a production job.

Generally, in a component mounting line for producing a component mounting board, components are mounted on a circuit board in order by multiple component mounting machines arranged along a conveyance path of the circuit board to produce the component mounting board.

Patent Literature

Patent Literature 1: International Publication WO2015/040755

BRIEF SUMMARY

Technical Problem

Generally, it is desirable to arrange backup pins in the vicinity of a position directly below a position where a component is mounted on a circuit board. In addition, since positions where components are mounted on the circuit board differ for each component mounting machine of a component mounting line, it is desirable to change the arrangement of the backup pins in accordance with the positions where components are mounted for each component mounting machine. Therefore, although there is a case where the arrangement of the backup pins differs for each component mounting machine, if the arrangement of the backup pins, which differs for each component mounting machine, is set in a production job, there is a drawback that creation work of the production job is complicated.

Therefore, in order to simplify the creation work of the production job, the arrangement of the backup pins only at positions common to multiple component mounting machines of the component mounting line is set in the production job.

However, if the backup pins are arranged only at positions common to multiple component mounting machines of the component mounting line, the backup pins at positions which are not common to multiple component mounting machines cannot be arranged. Therefore, there is a drawback that the backup pins cannot be arranged at positions originally desired to be arranged if the positions where the backup pins are to be arranged exist at positions which are not common to multiple component mounting machines.

Solution to Problem

In order to solve the above-mentioned problems, an automatic backup pin arrangement system for a component mounting machine configured to automatically arrange backup pins at positions designated in a production job is provided, the backup pins being capable of holding a circuit board, on which a component is mounted, from below, wherein an arrangement of the backup pins designated in the production job is used in common by multiple component mounting machines arranged along a conveyance path of the circuit board, and a position of each of the backup pins is designated at a position relative to the circuit board, an XY-robot performing a component mounting operation and an automatic backup pin arrangement operation is mounted on each of the component mounting machines, and a control device configured to control an operation of each of the component mounting machines determines whether a backup pin exists at a position where the backup pin cannot be automatically arranged in the arrangement of the backup pins designated in the production job, and when the backup pin exists at a position where the backup pin cannot be automatically arranged, the control device excludes the backup pin at the position from the arrangement of the backup pins designated in the production job and the excluded backup pin is not to be automatically arranged, and the control device automatically arranges only other backup pins at the positions designated in the production job.

In this configuration, the control device of each component mounting machine determines whether a backup pin exists at a position where the backup pin cannot be automatically arranged in the arrangements of the backup pins designated in the production job, and in a case where a backup pin exists at a position where the backup pin cannot be automatically arranged, the control device excludes the backup pin at the position from the arrangement of the backup pins designated in the production job not to be automatically arranged, and automatically arranges only the other backup pins at positions designated in the production job. Therefore, the arrangement of the backup pins designated in the production job can be designated not only by the arrangement of the backup pins at the positions common to the multiple component mounting machines but also by the arrangement of the backup pins at the positions which are not common to the multiple component mounting machines. Therefore, the control device of each component mounting machine can automatically arrange the backup pins at positions which are not common to the multiple component mounting machines in addition to the arrangement of the backup pins at the positions common to the multiple component mounting machines using the arrangement of the backup pins designated in the production job. Therefore, it is unnecessary to set the arrangement of the backup pins different for each component mounting machine in the production job, so that creation work of the production job can be simplified and the backup pins can be automatically arranged even if the positions where the backup pins are to be originally arranged are not common to the multiple component mounting machines.

DESCRIPTION OF EMBODIMENTS

Hereinafter, an embodiment disclosed in the present specification will be described.

Figure 1:
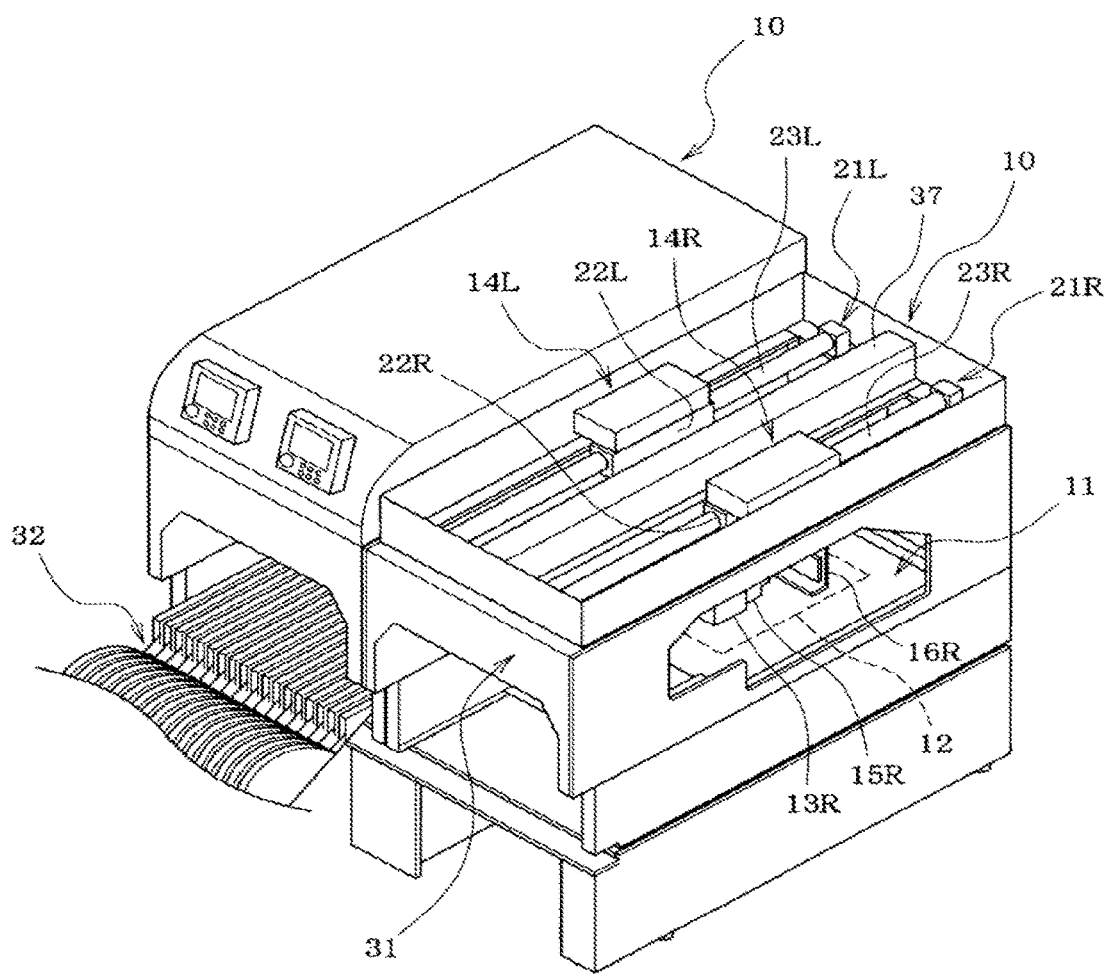
FIG. 1 is a perspective view illustrating an arrangement of two component mounting machines according to an embodiment in which a feeder, an upper cover, and the like are omitted from one component mounting machine.
Figure 2:
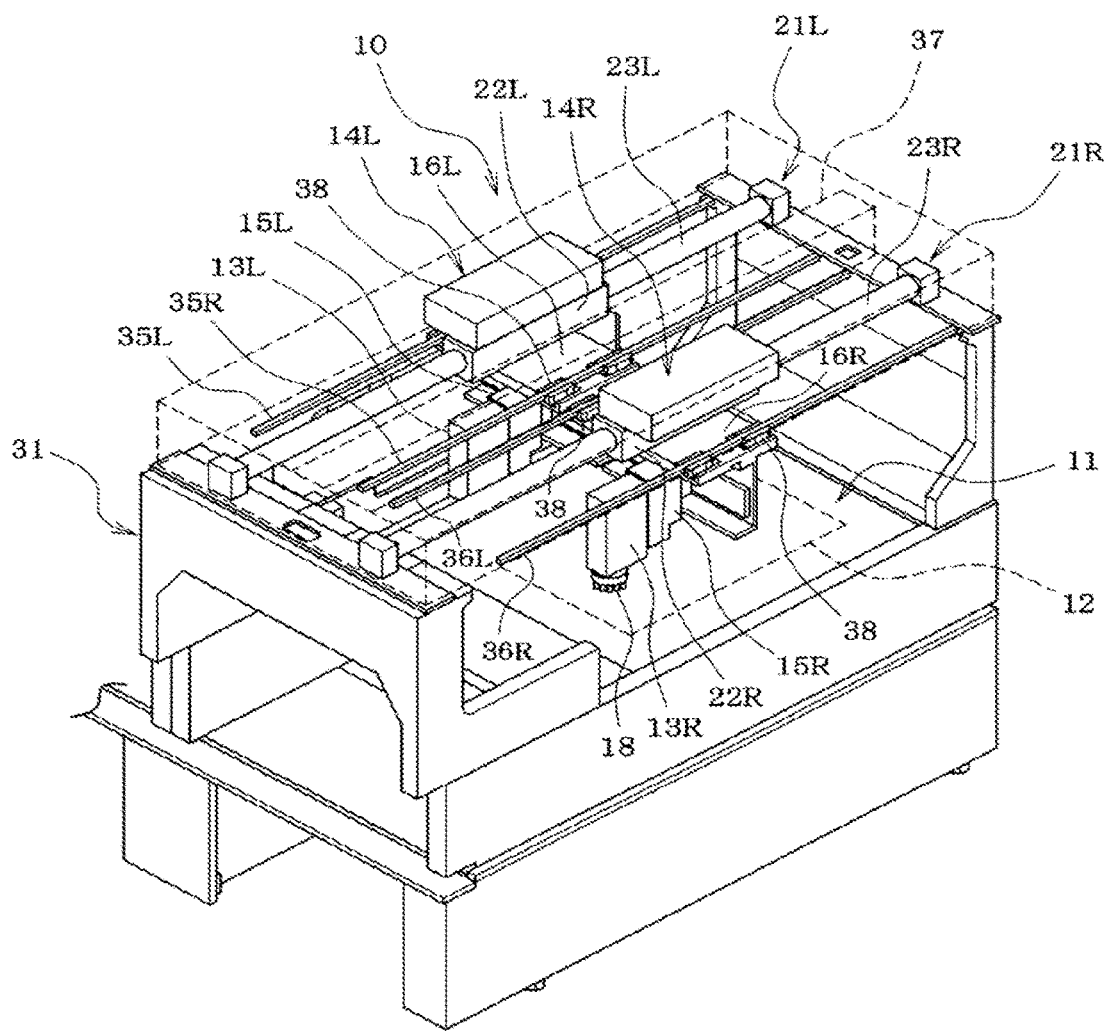
FIG. 2 is a perspective view of the component mounting machine in which the feeder, the upper cover, and the like are omitted.
Figure 2:
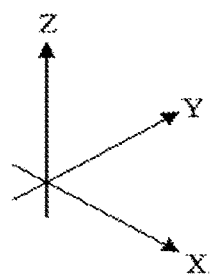
Figure 3:
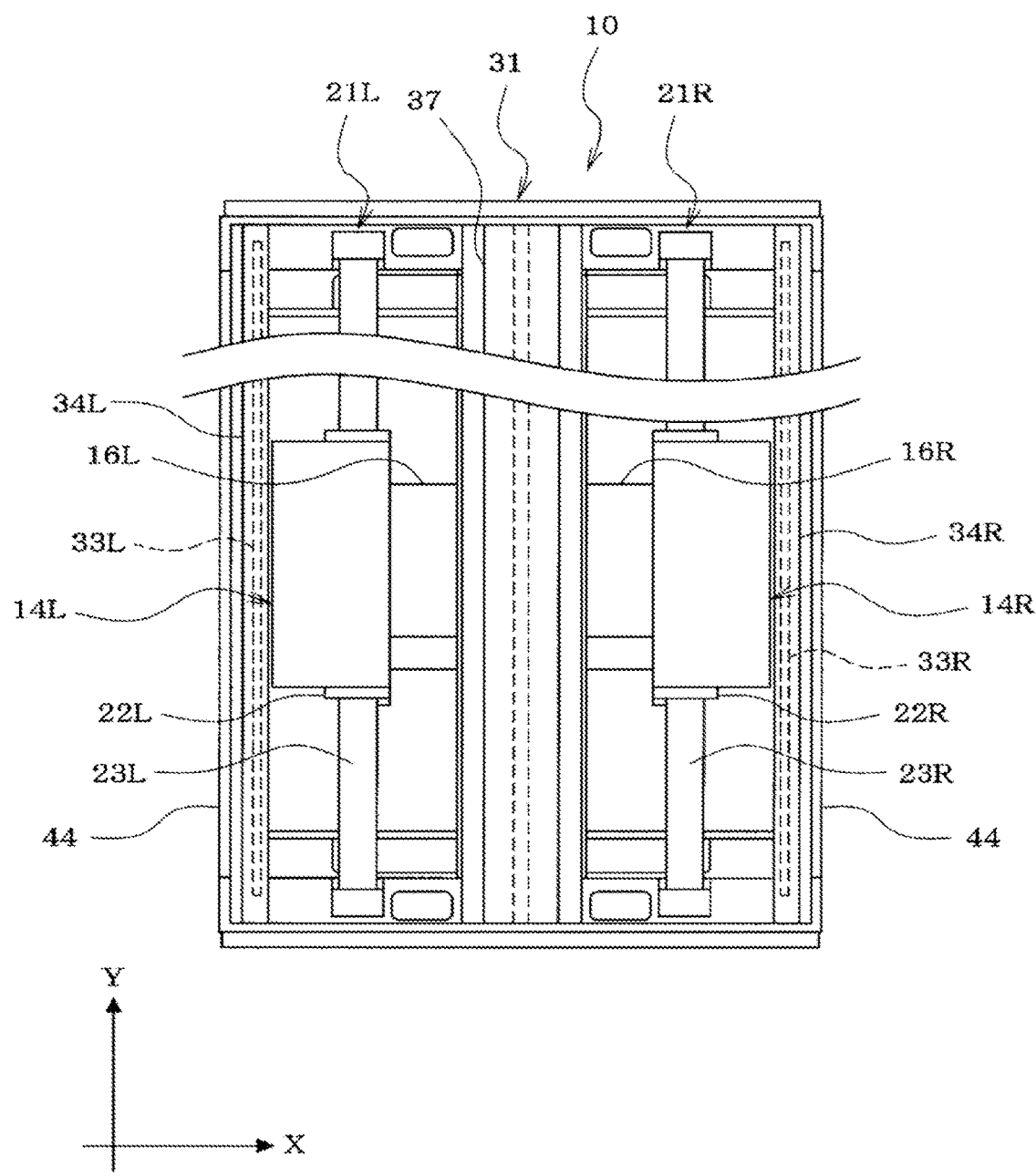
FIG. 3 is a plan view of the component mounting machine illustrated in FIG. 2.

First, a configuration of component mounting machine 10 will be described with reference to FIGS. 1 to 3. Multiple component mounting machines 10 are arranged in a component mounting line for producing a component mounting board. FIG. 1 illustrates an example in which two component mounting machines 10 are installed.

Each component mounting machine 10 has a configuration in which two mounting heads 13L and 13R (refer to FIG. 2) for mounting components on circuit board 12 conveyed by conveyor 11, and two XY-robots 14L and 14R for moving two mounting heads 13L and 13R separately in X-direction, which is a conveyance direction of circuit board 12, and in Y-direction, which is a direction orthogonal to X-direction, are installed.

Figure 7:
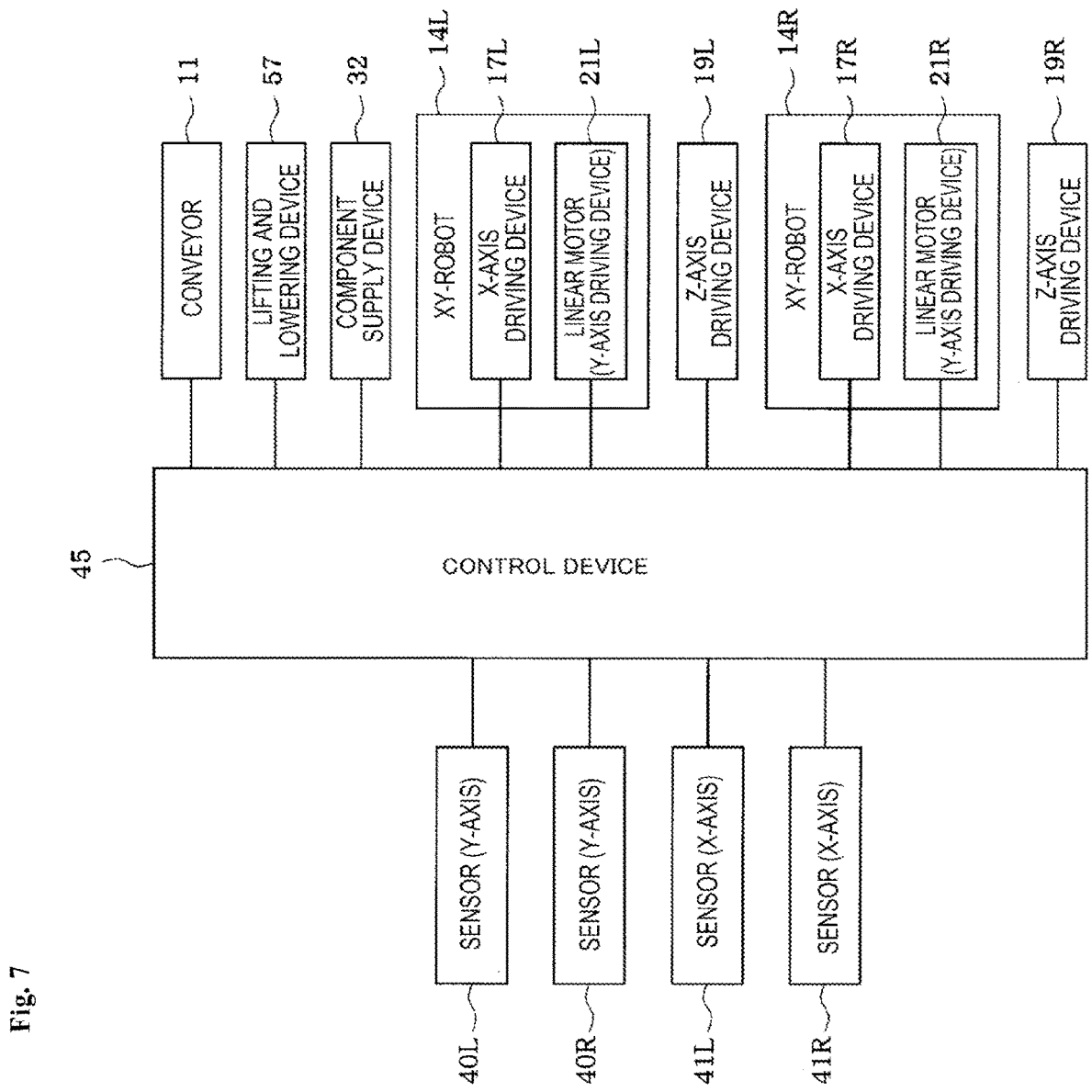
FIG. 7 is a block diagram illustrating a configuration of a control system of the component mounting machine.

Two XY-robots 14L and 14R have the same configuration and the same size, and are configured by combining two X-slides 15L and 15R for separately moving two mounting heads 13L and 13R in X-direction, and two Y-slides 16L and 16R for separately moving X-slides 15L and 15R in Y-direction. Two XY-robots 14L and 14R are arranged such that two Y-slides 16L and 16R move, in Y-direction, movable areas AL and AR (movable area AL on a board loading side and movable area AR on a board unloading side illustrated in FIG. 5) different in X-direction. Further, Y-slides 16L and 16R respectively support X-slides 15L and 15R, and Y-slides 16L and 16R respectively supports X-axis driving devices 17L and 17R (refer to FIG. 7), which are driving sources for respectively moving X-slides 15L and 15R in X-direction.

Figure 5:
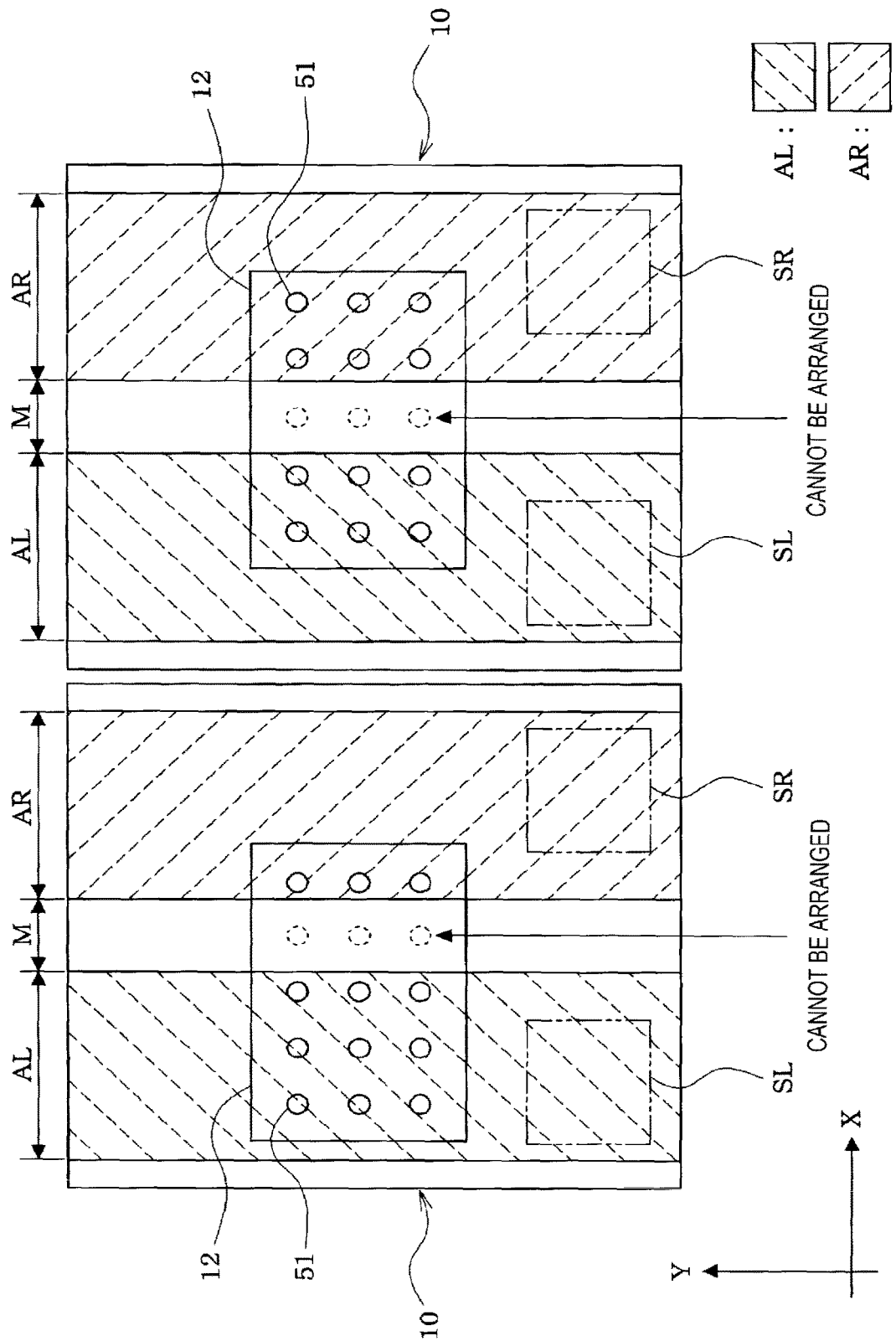
FIG. 5 is a plan view for explaining a positional relationship among a movable area of two XY-robots of each of the adjacent component mounting machines, an area outside a movement range, and a conveyance stop position of a circuit board.

In this case, as illustrated in FIG. 5, movable areas AL and AR (movable area AL on the board loading side and movable area AR on the board unloading side) in which two XY-robots 14L and 14R can move are located apart in X-direction, which is the conveyance direction of circuit board 12, so that area M outside the movement range exists between movable areas AL and AR of two XY-robots 14L and 14R, and a component mounting operation and an automatic backup pin arrangement operation described later can be performed only in movable areas AL and AR.

Each of X-axis driving devices 17L and 17R is configured by using, for example, a feeding screw device, a linear motor, or the like. In addition, mounting heads 13L and 13R are respectively supported by X-slides 15L and 15R, which are respectively supported by Y-slides 16L and 16R, and a mark imaging camera (not illustrated) for imaging a board mark of circuit board 12 is supported by each of X-slides 15L and 15R.

Each of mounting heads 13L and 13R holds one or multiple suction nozzles 18 (refer to FIG. 2) for picking up of a component. Further, mounting heads 13L and 13R are respectively provided with Z-axis driving devices 19L and 19R (refer to FIG. 7) for each lowering/lifting suction nozzle 18 during a component pickup operation or a component mounting operation. Each of mounting heads 13L and 13R may be a rotary-type mounting head or may be a mounting head that does not rotate.

Y-axis driving devices serving as driving sources for respectively moving of Y-slides 16L and 16R in Y-direction are respectively configured by using linear motors 21L and 21R. In two linear motors 21L and 21R, shaft-type stators 23L and 23R respectively extend in parallel with Y-direction, both end portions of each of stators 23L and 23R in Y-direction are supported by mounting machine body 31, and Y-slides 16L and 16R are respectively attached to movable elements 22L and 22R, which linearly move along stators 23L and 23R, respectively. A position of each of linear motors 21L and 21R in X-direction is a position corresponding to a center of each of Y-slides 16L and 16R in a width in X-direction. In the present embodiment, each of linear motors 21L and 21R is a shaft-type linear motor, but may be a flat-type linear motor. The Y-axis driving device may be configured by using a feeding screw device instead of the linear motor.

Mounting machine body 31 supporting both end portions of stators 23L and 23R of each of linear motors 21L and 21R is a box-type structure configured to constitute a framework of component mounting machine 10. Conveyor 11 for conveying circuit board 12 in X-direction is disposed inside the body, and two mounting heads 13L and 13R are configured to move above conveyor 11 in XY-directions. A space for setting component supply device 32 (refer to FIG. 1), such as a tape feeder or a tray feeder, for supplying components is provided on a front surface side of mounting machine body 31.

In order to measure positional information (Y-coordinate) of each of Y-slides 16L and 16R in Y-direction, which is positional information (Y-coordinate) of each of mounting heads 13L and 13R in Y-direction, two linear scales 33L and 33R (refer to FIG. 3) are provided on mounting machine body 31 so as to extend parallel to Y-direction. Each of linear scales 33L and 33R may be of any type, for example, such as a magnetic-type, a photoelectric-type (optical-type), or an electromagnetic induction-type.

Each of guide rails 35R and 36L (refer to FIG. 2) for guiding an inner end portion of each of Y-slides 16L and 16R in Y-direction is attached to a lower surface side of middle frame 37 (refer to FIGS. 1 to 3) provided in a beam shape at a center portion (between two XY-robots 14L and 14R) of mounting machine body 31. Guide members 38 (refer to FIG. 1) slidably fitted into each of guide rails 35L, 35R, 36L, and 36R are provided on left and right both end portions of each of Y-slides 16L and 16R.

Each of sensors 40L and 40R (refer to FIG. 7) for reading the positional information of each of Y-slides 16L and 16R in Y-direction is provided at a position among each of Y-slides 16L and 16R, where the positional information of each of Y-slides 16L and 16R in Y-direction can be read from each of linear scales 33L and 33R.

In order to measure the positional information (X-coordinate) of each of X-slides 15L and 15R in X-direction, which is the positional information (X-coordinate) of each of mounting heads 13L and 13R in X-direction, each of sensors 41L and 41R (refer to FIG. 7) is provided. Although a configuration for measuring the positional information of each of X-slides 15L and 15R in X-direction is not illustrated, for example, each linear scale may be provided on each of Y-slides 16L and 16R along X-direction, which is the movement direction of each of X-slides 15L and 15R, and each of sensors 41L and 41R for reading the positional information of each of X-slides 15L and 15R in X-direction from each linear scale may be provided on each of X-slides 15L and 15R. Alternatively, in a case where a feeding screw device is used as each of X-axis driving devices 17L and 17R for moving each of X-slides 15L and 15R in X-direction, the positional information (X-coordinate of mounting heads 13L and 13R) of each of X-slides 15L and 15R in X-direction may be calculated from a count value by counting output pulses of encoders (sensors 41L and 41R) provided in a motor of the feeding screw device.

Figure 4:
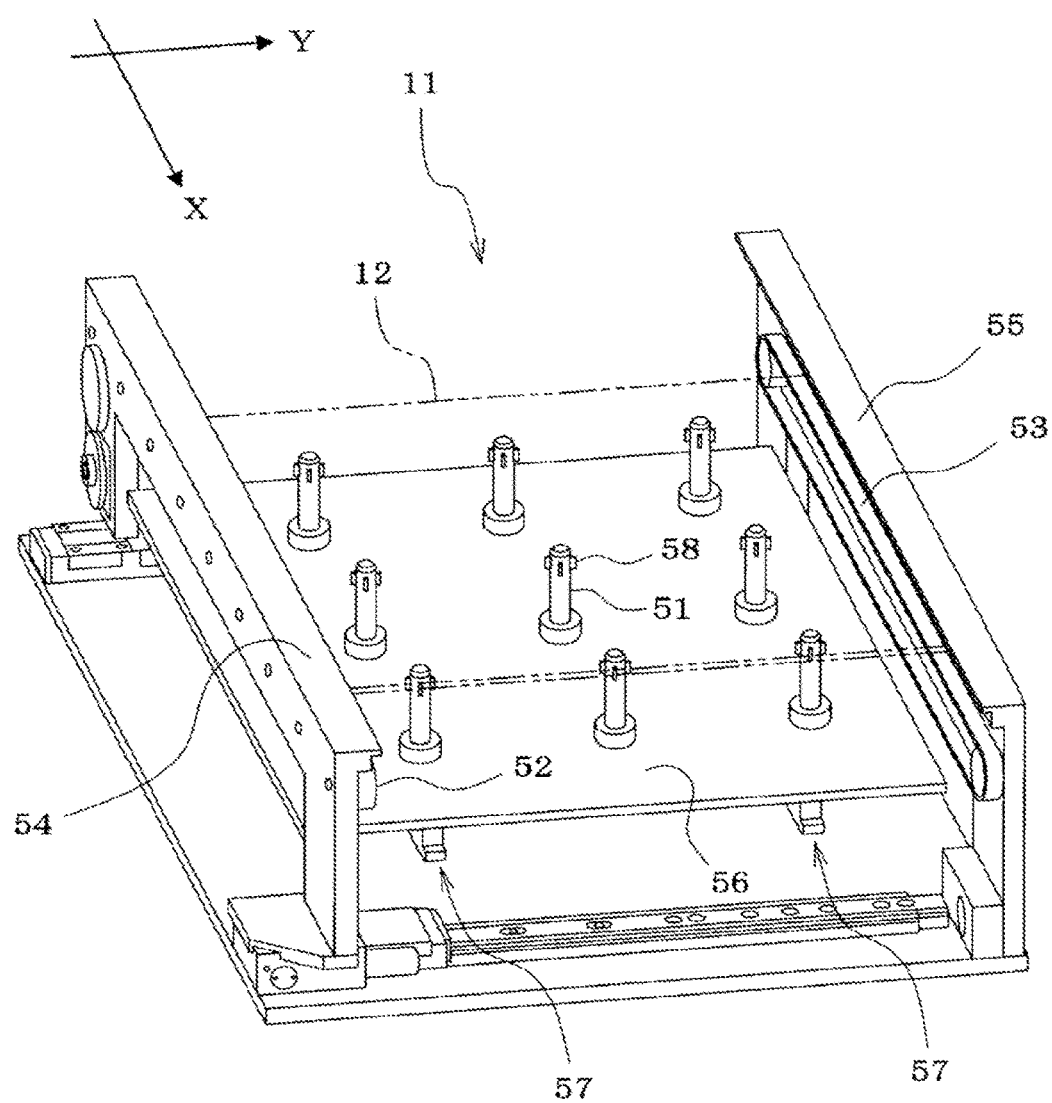
FIG. 4 is a perspective view illustrating a positional relationship among a conveyor, a backup plate, and backup pins.

Next, a configuration of conveyor 11 will be described with reference to FIG. 4. Conveyor belts 52 and 53 are arranged in parallel with the conveyance direction of circuit board 12 so as to place and convey both side portions of circuit board 12, rail 55 holding one conveyor belt 53 is a reference rail a position of which is fixed, and rail 54 holding other conveyor belt 52 is a movable rail that moves in a width direction in accordance with a width of circuit board 12.

Backup plate 56 on which multiple backup pins 51 are placed is provided horizontally on conveyor 11. Backup plate 56 is formed of a magnetic material such as iron, so that backup pin 51 is picked up and held on backup plate 56 by a magnet (not illustrated) provided at a lower portion of backup pin 51. Backup plate 56 is configured to be lifted and lowered by lifting and lowering device 57 so that backup plate 56 lifts to an upper limit position when clamping circuit board 12 that has been loaded, and backup plate 56 lowers to a lower limit position when releasing the clamping of circuit board 12.

In the present embodiment, a size of backup plate 56 is formed larger than a size of circuit board 12, stock area S for storing backup pins 51 is provided in a portion of backup plate 56 protruding from a position directly below circuit board 12 and in a range of movable areas AL and AR of XY-robots 14L and 14R, so that stock area S can store at least the number of backup pins 51 which is required for the arrangement of backup pins 51 designated at least in the production job. Stock area S may be provided at a different location (for example, in the vicinity of conveyor belts 52 and 53) from backup plate 56, and in short, may be provided at a location where mounting heads 13L and 13R do not interfere with constituent members of circuit board 12 and conveyor 11 within the range of movable areas AL and AR of XY-robots 14L and 14R.

In the present embodiment, multiple engagement protrusions 58 are provided at equal angular intervals on an upper outer periphery of backup pin 51. When XY-robots 14L and 14R automatically arrange backup pins 51 on backup plate 56, engagement protrusions 58 of backup pin 51 are engaged and held in a bayonet engagement manner by engagement holding tools (not illustrated) exchangeably attached to mounting heads 13L and 13R of XY-robots 14L and 14R. Backup pin 51 may be clamped by a chuck (not illustrated) exchangeably attached to mounting heads 13L and 13R.

Control device 45 for controlling an operation of each component mounting machine 10 of the component mounting line is configured by one or multiple computers (CPUs), controls a board conveyance operation of conveyor 11, moves each of mounting heads 13L and 13R separately in XY-directions by each of XY-robot 14L and 14R, and controls the component pickup operation for picking up a component supplied from component supply device 32 by suction nozzle 18 and the component mounting operation for mounting the component on circuit board 12.

Further, when production in accordance with the production job (production program) is started, control device 45 of each component mounting machine 10 of the component mounting line controls operations of two XY-robots 14L and 14R, picks up backup pins 51 stored in stock area S of backup plate 56, and performs the automatic backup pin arrangement operation at the position designated in the production job in backup plate 56, and then starts the production.

Figure 6:
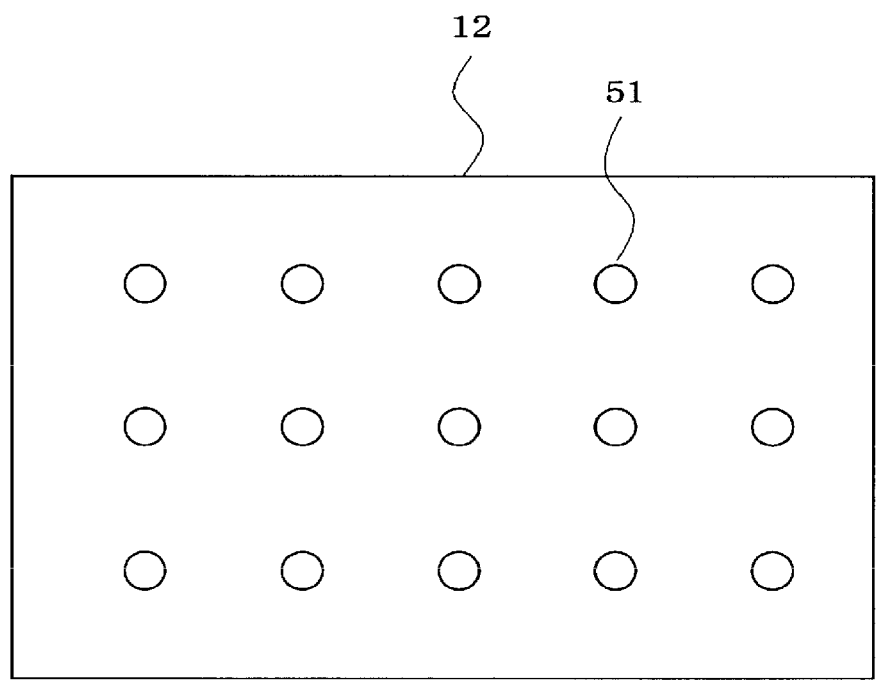
FIG. 6 is a plan view illustrating an image of the arrangement of the backup pins designated in the production job.

The arrangement of backup pins 51 designated in the production job is used in common by multiple component mounting machines 10 constituting the component mounting line, and, as illustrated in FIG. 6, the position of backup pins 51 is designated at a position relative to circuit board 12. This is because, as illustrated in FIG. 5, a conveyance stop position of circuit board 12 may differ for each component mounting machine 10.

As illustrated in FIG. 5, since movable areas AL and AR in which two XY-robots 14L and 14R of each component mounting machine 10 can move are located apart in X-direction, which is the conveyance direction of circuit board 12, area M exists outside the movement range between movable areas AL and AR of two XY-robots 14L and 14R. Since the component mounting operation and the automatic backup pin arrangement operation can be performed only in movable areas AL and AR, in a case where each component mounting machine 10 stops the conveyance of circuit board 12 at a position straddling area M outside the movement range and mounts the components on circuit board 12 by two XY-robots 14L and 14R, as illustrated in FIG. 5, a relative positional relationship between circuit board 12 and area M outside the movement range is changed by changing the conveyance stop position of circuit board 12 for each component mounting machine 10 to change the mountable area of circuit board 12 for each component mounting machine 10, so that the components are mounted.

Since each component mounting machine 10 cannot automatically arrange backup pins 51 in area M outside the movement range, control device 45 of each component mounting machine 10 determines whether backup pin 51 exists at a position corresponding to area M outside the movement range in the arrangement of backup pins 51 designated in the production job in consideration of the relative positional relationship between the conveyance stop position of circuit board 12 and area M outside the movement range, and in a case where backup pin 51 exists at the position corresponding to area M outside the movement range, excludes backup pin 51 at the position from the arrangement of backup pins 51 designated in the production job not to be automatically arranged while remaining backup pin 51 in stock area S, takes out only other backup pins 51 from stock area S, and automatically arranges only the other backup pins 51 at the positions designated in the production job.

According to the present embodiment described above, control device 45 of each component mounting machine 10 of the component mounting line determines whether backup pin 51 exists at a position where backup pin 51 cannot be automatically arranged based on a positional relationship between area M outside the movement range in the arrangement of backup pins 51 designated in the production job and the conveyance stop position of circuit board 12. In a case where backup pin 51 exists at a position where that backup pin 51 cannot be automatically arranged, excludes backup pin 51 at the position from the arrangement of backup pins 51 designated in the production job not to be automatically arranged, and automatically arranges only other backup pins 51 at the positions designated in the production job. Therefore, the arrangement of backup pins 51 designated in the production job can be designated not only by the arrangement of backup pins 51 at positions common to multiple component mounting machines 10 of the component mounting line but also by the arrangement of backup pins 51 at positions which are not common to multiple component mounting machines 10. Therefore, control device 45 of each component mounting machine 10 can automatically arrange backup pins 51 at positions which are not common to multiple component mounting machines 10 in addition to the arrangement of backup pins 51 at positions common to multiple component mounting machines 10 using the arrangement of backup pins 51 designated in the production job. Therefore, it is unnecessary to set the arrangement of backup pins 51 different for each component mounting machine 10 in the production job, so that creation work of the production job can be simplified and backup pins 51 can be automatically arranged even if the positions where backup pins 51 are to be originally arranged are not common to multiple component mounting machines.

In the above embodiment, two XY-robots 14L and 14R are installed on component mounting machine 10, but the present disclosure can be applied to a component mounting machine on which only one XY-robot is mounted to be carried out. Generally, it is desirable to arrange backup pins in the vicinity of a position directly below a position where a component is mounted on a circuit board. Since the positions where components are mounted on the circuit board differ for each component mounting machine, it is desirable to change the arrangement of the backup pins in accordance with the positions where the components are mounted for each component mounting machine. However, in a case where a component is mounted on an upper surface of a circuit board where a component is mounted on a lower surface thereof, the component may be mounted in the vicinity of a position directly below a position at which the component is mounted on the upper surface of the circuit board. In such a case, the mounted component existing in the vicinity of a position directly below the position where the component is mounted interfere, so that a backup pin cannot be automatically arranged. Accordingly, the control device of each component mounting machine of the component mounting line determines whether a backup pin exists at a position where the backup pin cannot be automatically arranged by interference with the mounted component on the lower surface side of the circuit board in the arrangement of the backup pins designated in the production job, and when a backup pin exists at a position where the backup pin cannot be automatically arranged, excludes the backup pin at the position from the arrangement of the backup pins designated in the production job not to be automatically arranged, and automatically arranges only the other backup pins at the positions designated in the production job.

The present disclosure is not limited to the above embodiment, and it is needless to say that the present disclosure can be practiced by various modifications without departing from the gist thereof, for example, two conveyors are arranged in parallel in each component mounting machine, the backup pins may be automatically arranged on two circuit boards loaded in each component mounting machine to mount the components on the two circuit boards, the configuration of backup pin 51 may be changed, or the like.

REFERENCE SIGNS LIST

10: component mounting machine, 11: conveyor, 12: circuit board, 13L, 13R: mounting head, 14L, 14R: XY-robot, 15L, 15R: X-slide, 16L, 16R: Y-slide, 17L, 17R: X-axis driving device, 18: suction nozzle, 19L, 19R: Z-axis driving device, 21L, 21R: linear motor, 31: mounting machine body, 32: component supply device, 45: control device, 51: backup pin, 56: backup plate, AL, AR: movable area, M: area outside movement range

The invention claimed is:

1. An automatic backup pin arrangement system for a component mounting machine configured to automatically arrange backup pins at positions designated in a production job, the backup pins configured to hold a circuit board, on which a component is mounted, from below, wherein
an arrangement of the backup pins designated in the production job is used in common by multiple component mounting machines arranged along a conveyance path of the circuit board, and a position of each of the backup pins is designated at a position relative to the circuit board,
two XY-robots configured to perform a component mounting operation and an automatic backup pin arrangement operation are mounted on each of the component mounting machines, and
a control device configured to
determine whether a backup pin exists in an area outside a movement range between movable areas of the two XY-robots as a position where the backup pin cannot be automatically arranged in the arrangement of the backup pins designated in the production job,
exclude the backup pin from being automatically arranged at the position from the arrangement of the backup pins designated in the production job when the backup pin exists at the position where the backup pin cannot be automatically arranged, and
arrange only other backup pins at the positions designated in the production job.

2. The automatic backup pin arrangement system for a component mounting machine according to claim 1, wherein
the movable areas in which the two XY-robots can move are located apart in an X-direction being a conveyance direction of the circuit board, and the component mounting operation and the automatic backup pin arrangement operation can be performed only in the movable areas, when each of the component mounting machines stops a conveyance of the circuit board at a position straddling the area outside the movement range and mounts the component on the circuit board by the two XY-robots, a relative positional relationship between the circuit board and the area outside the movement range is changed by changing a conveyance stop position of the circuit board for each of the component mounting machines to change a position of a mountable area of the circuit board for each of the component mounting machines to mount the component, and the control device of each of the component mounting machines determines whether a backup pin exists at the position corresponding to the area outside the movement range in the arrangement of the backup pins designated in the production job in consideration of a relative positional relationship between the conveyance stop position of the circuit board and the area outside the movement range, and when the backup pin exists at the position corresponding to the area outside the movement range, the control device excludes the backup pin at the position from the arrangement of the backup pins designated in the production job and the backup pin is not to be automatically arranged, and the control device automatically arranges only the other backup pins at the positions designated in the production job.

3. The automatic backup pin arrangement system for a component mounting machine according to claim 2, wherein a backup plate on which the backup pins are placed is provided, the backup plate is larger than the circuit board, a stock area is provided in a portion of the backup plate protruding outside the circuit board and in a range of the movable areas of the XY-robots, the stock area configured to store at least a number of the backup pins required for the arrangement of the backup pins designated in the production job, and the control device of each of the component mounting machines leaves in the stock area the backup pins excluded from the arrangement of the backup pins designated in the production job and the excluded backup pins are not to be automatically arranged, the control device takes out only the other backup pins from the stock area, and automatically arranges the other backup pins at the positions designated in the production job.

* * * * *